(12) United States Patent
Sieradzki et al.

(10) Patent No.: US 7,586,111 B2
(45) Date of Patent: Sep. 8, 2009

(54) ION IMPLANTER HAVING COMBINED HYBRID AND DOUBLE MECHANICAL SCAN ARCHITECTURE

(75) Inventors: Manny Sieradzki, Manchester, MA (US); Patrick Splinter, Middleton, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 237 days.

(21) Appl. No.: 11/831,744

(22) Filed: Jul. 31, 2007

(65) Prior Publication Data

US 2009/0032726 A1 Feb. 5, 2009

(51) Int. Cl.
*H01J 37/317* (2006.01)
*H01J 29/51* (2006.01)
*G21K 1/08* (2006.01)

(52) U.S. Cl. .............. 250/492.21; 250/492.2; 250/281; 250/282; 250/397; 250/396 R (58) Field of Classification Search ............ 250/492.21, 250/492.2, 281, 282, 397, 396 R
See application file for complete search history.

(56) References Cited

U.S. PATENT DOCUMENTS

| | | | |
|---|---|---|---|
| 6,777,696 B1 | 8/2004 | Rathmell et al. | |
| 6,992,309 B1 | 1/2006 | Petry et al. | |
| 6,992,310 B1 * | 1/2006 | Ferrara et al. | 250/492.21 |
| 7,135,691 B2 | 11/2006 | Vanderpot et al. | |
| 7,399,980 B2 * | 7/2008 | Vanderberg et al. | 250/492.21 |
| 7,507,978 B2 * | 3/2009 | Vanderberg et al. | 250/492.21 |
| 2006/0113494 A1 | 6/2006 | Chen et al. | |

* cited by examiner

*Primary Examiner*—Nikita Wells
(74) *Attorney, Agent, or Firm*—Eschweiler & Associates, LLC (57) ABSTRACT

A system and method are provided for implanting ions into a workpiece in a plurality of operating ranges. A desired dosage of ions is provided, and a spot ion beam is formed from an ion source and mass analyzed by a mass analyzer. Ions are implanted into the workpiece in one of a first mode and a second mode based on the desired dosage of ions, where in the first mode, the ion beam is scanned by a beam scanning system positioned downstream of the mass analyzer and parallelized by a parallelizer positioned downstream of the beam scanning system. In the first mode, the workpiece is scanned through the scanned ion beam in at least one dimension by a workpiece scanning system. In the second mode, the ion beam is passed through the beam scanning system and parallelizer un-scanned, and the workpiece is two-dimensionally scanned through the spot ion beam.

20 Claims, 6 Drawing Sheets

ION IMPLANTER HAVING COMBINED HYBRID AND DOUBLE MECHANICAL SCAN ARCHITECTURE

FIELD OF THE INVENTION

The present invention relates generally to ion implantation systems and methods, and more specifically to an ion implantation system and method for implanting ions in a plurality of operating ranges.

BACKGROUND OF THE INVENTION

Ion implanters are conventionally utilized to place a specified quantity of dopants or impurities within semiconductor workpieces or wafers. In a typical ion implantation system, a dopant material is ionized, therein generating a beam of ions. The ion beam is directed at a surface of the semiconductor wafer to implant ions into the wafer, wherein the ions penetrate the surface of the wafer and form regions of desired conductivity therein. For example, ion implantation has particular use in the fabrication of transistors in semiconductor workpieces, A typical ion implanter comprises an ion source for generating the ion beam, a beamline assembly having a mass analysis apparatus for directing and/or filtering (e.g., mass resolving) ions within the beam, and a target chamber containing one or more wafers or workpieces to be treated.

Various types of ion implanters allow respectively varied dosages and energies of ions to be implanted, based on the desired characteristics to be achieved within the workpiece. For example, high-current ion implanters are typically used for high dose implants, and wherein medium-current to low-current ion implanters are utilized for lower dose applications. An energy of the ions can further vary, wherein the energy generally determines the depth to which the ions are implanted within the workpiece, e.g. to control junction depths in semiconductor devices.

As device geometries continue to shrink, shallow junction contact regions translate into requirements for higher ion beam currents at lower and lower energies. Additionally, requirements for precise dopant placement have resulted in ever-more demanding requirements for minimizing beam angle variation, both within the beam, and across the substrate surface. For example, in certain applications, high current implants at energies down to 300 electron Volts are desirable, while concurrently minimizing energy contamination, maintaining tight control of angle variation within the ion beam as well as across the workpiece, and also while providing high workpiece processing throughput.

At present, the preferred architecture to achieve high currents at low energies while minimizing angle variation is a dual-mechanical scan architecture, wherein the workpiece is mechanically scanned in two directions (e.g., a "fast" scan direction and a generally perpendicular "slow" scan direction) relative to a stationary spot ion beam. However, the relatively modest "fast" scan frequency utilizing this conventional architecture is limited by maximum accelerations that the mechanical systems can tolerate, and generally ranges between 1-3 Hz, thus limiting the maximum throughput of workpieces through the ion implanter. Ribbon beam systems, on the other hand, utilize son beam optics for steering and shaping a ribbon-shaped ion beam, and are capable of achieving reasonably high currents at low energies. However, uniform current densities in conventional ribbon beam systems may be difficult to achieve, often at the expense of loss of angle accuracy. Hybrid scan technologies have also been provided utilizing electrostatic or magnetic "fast" scans of pencil or spot ion beams and mechanical "slow" scans of the workpiece, however, these conventional hybrid implanters further suffer beam transport problems resulting from the relatively higher space-charge density In a pencil beam and longer beam line length, especially at energies below 5 keV.

Conventionally, high dose implants and lower dose implants require the utilization of separate dose-specific ion implanters, wherein each implanter is designed for the respective higher or lower dose ion implantation architecture. Such a requirement for multiple ion implanters thus increases equipment cost to the semiconductor product manufacturer, as well as increasing the cost of ownership of the particular implanters. Thus, it can be appreciated that an improved beamline architecture is desirable for providing both a high dose implant and a lower dose implant utilizing a common ion implantation system,

SUMMARY OF THE INVENTION

The present invention overcomes the limitations of the prior art by providing a system, apparatus, and method that combines high current capabilities and angle control of a two-dimensional mechanical scan or "spot" ion beam implanter for high dose implants with the productivity of a hybrid scanned implanter for mid and lower dose implants. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a system and method for implanting ions in a plurality of operating ranges. In accordance with the invention, an ion implantation system is provided, wherein the ion implantation system comprises an ion source configured to generate a beam of ions having a generally elliptical cross-section, therein defining a spot or pencil ion beam. The ion implantation system further comprises a mass analyzer configured to mass resolve the beam of ions, and a beam scanning system positioned downstream of the mass analyzer.

In accordance with the invention, the ion implantation system is configured to selectively operate in a first mode and a second mode, based on a desired dosage of ions and/or ion beam current or energy to be implanted into a workpiece. The first mode, for example, is associated with a first operating range, such as for low dose ion implantation. In the first mode, the beam scanning system is configured to scan the beam of ions along a single beam scan plane, thus defining a scanned ion beam.

According to one exemplary aspect of the invention, a parallelizer is positioned downstream of the beam scanning system, wherein the parallelizer is configured to selectively bend the scanned ion beam into a substantially S-shape when the ion implantation system is operated in the first mode. As such, contaminants associated with the scanned ion beam are generally filtered out while concurrently parallelizing the scanned ion beam into a ribbon-shaped beam comprising a plurality of parallel beamlets, wherein the plurality of parallel beamlets have a substantially equal length. Accordingly, the plurality of parallel beamlets of the scanned ion beam can be uniformly implanted into a workpiece positioned on a workpiece scanning system residing downstream of the parallelizer. When the ion implantation system is operating in the first mode, the workpiece scanning system is configured to selectively translate the workpiece in one dimension through the scanned ion beam, therein implanting ions at the desired dosage and/or current or energy within the first operating range. Accordingly, in the first mode, the ion implantation system can be operated in a "mechanically-limited" throughput manner, wherein medium to low-dose implants can be achieved at a substantially high workpiece throughput, and wherein an upper limit of the workpiece throughput is mainly governed by mechanical capabilities (e.g., speed) of the workpiece scanning system to translate workpieces through the scanned ion beam.

In accordance with the present invention, the beam scanning system is further configured to pass the beam of ions un-scanned when the ion implantation system is operated in the second mode, therein defining an un-scanned spot ion beam. The second mode, for example, is associated with a second operating range, such as a high current, or high dosage implantation. In one example, the un-scanned spot ion beam is further bent into the S-shape via the parallelizer, and the workpiece scanning system is configured to selectively translate the workpiece in two dimensions through the un-scanned spot ion beam, therein implanting ions at the desired current, energy, and/or dosage within the second operating range. Accordingly, with the ion implantation system operating in the second mode, the ion implantation system can be operated in an "implant-limited" throughput manner, wherein high-dose implants can be achieved, and wherein an upper limit of the current and/or dosage of the implants is mainly governed by the capabilities of the ion source and the ion beam transport system.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally toward an ion implantation system and method for implanting ions in a workpiece, wherein a plurality of differing modes of operation of the implantation system can be implemented for a plurality of operating ranges. Accordingly, the present invention will now be described with reference to the drawings, wherein like reference numerals may be used to refer to like elements throughout, it should be understood that the description of these aspects are merely illustrative and that they should not be interpreted in a limiting sense. In the following description, for purposes of explanation, numerous specific details are set forth in order to provide a thorough understanding of the present invention. It will be evident to one skied in the art, however, that the present invention may be practiced without these specific details.

Figure 1A:
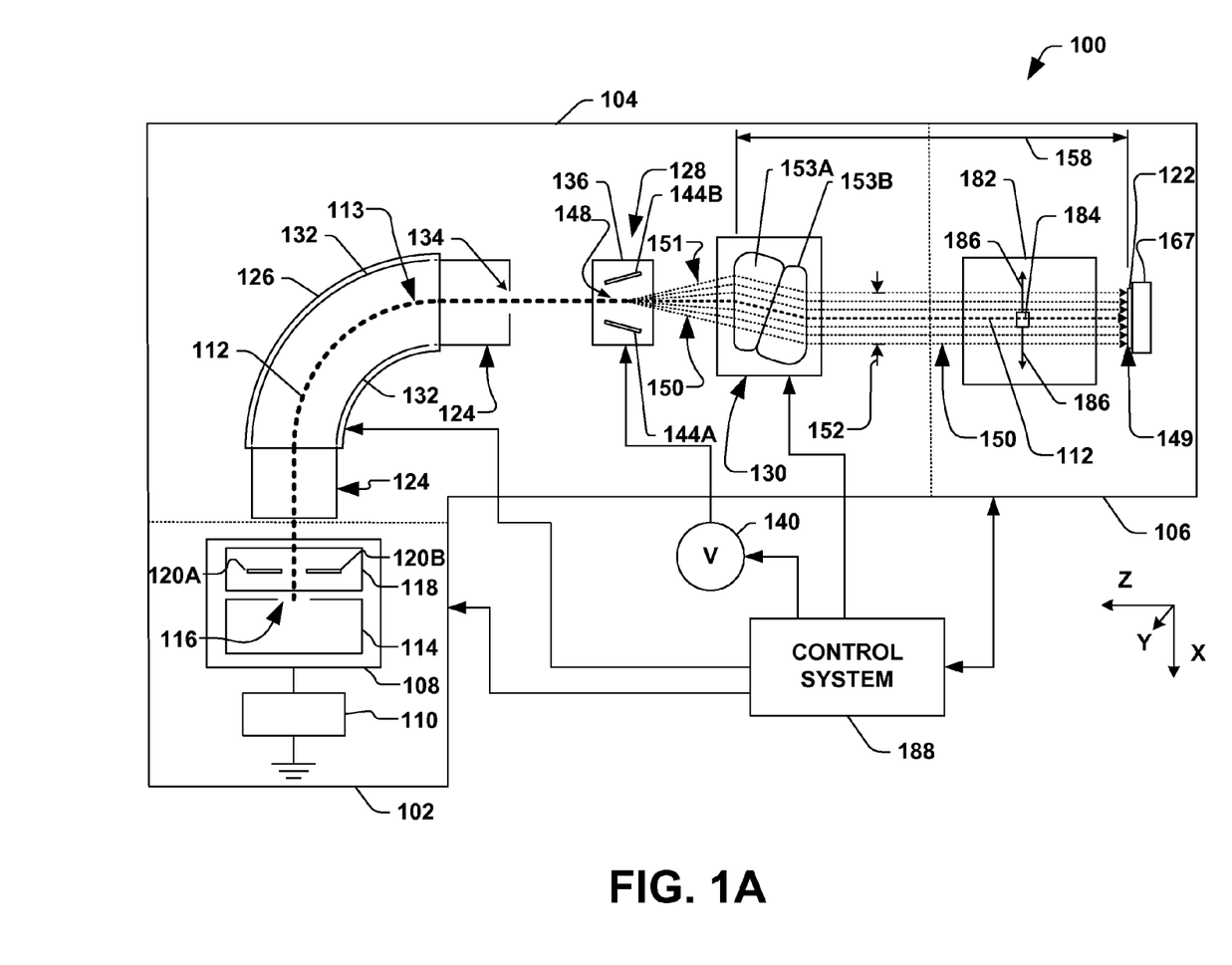
FIGS. 1A and 1B are block diagrams illustrating an exemplary ion implantation system having a common architecture for a plurality of operating ranges according to one aspect of the present invention.
Figure 1B:
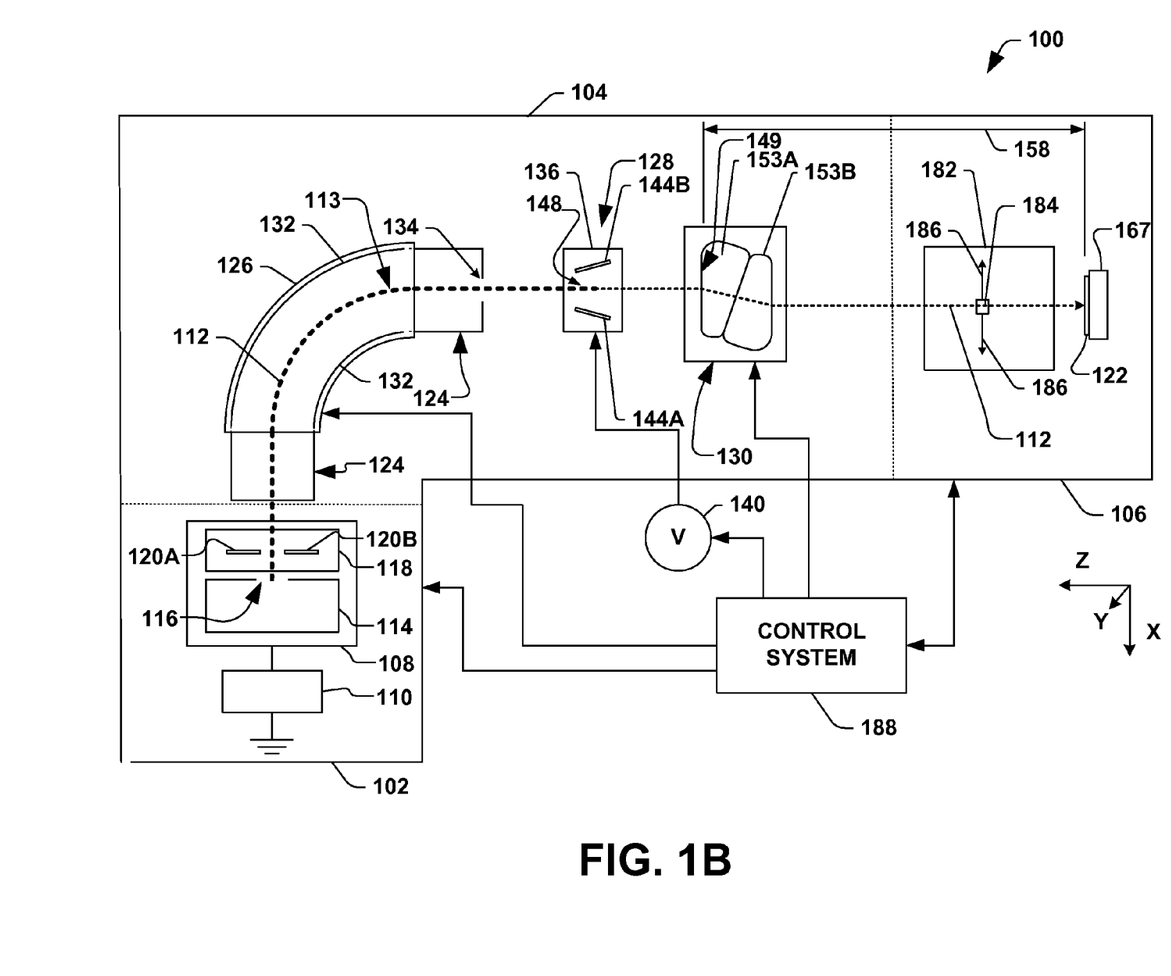

Referring now to the figures, FIG. 1 illustrates an exemplary ion implantation system 100 according to one aspect of the present invention, wherein the ion implantation system can be controlled to implant ions at various energies, currents, and/or dosages, as will be described herein. The ion implantation system 100 (also called an ion implanter) comprises a terminal 102, a beamline assembly 104, and an end station 108, wherein the terminal comprises an ion source 108 powered by a high voltage power supply 110. The ion source 108 is thus operable to produce an ion beam 112, and to direct the ion beam to the beamline assembly 104. The ion source 108, for example, generates charged ions that are extracted and formed into the ion beam 112, wherein the ion beam is directed along a nominal beam path 113 within the beamline assembly 104 and toward the end station 108. It should be noted that the ion beam 112 of the present invention has a relatively narrow profile (e.g., a generally circular cross-section when viewed from along the nominal beam path 113), and is hereinafter alternatively referred to as a "pencil" or "spot" ion beam.

In order to generate the ions, a gas of a dopant material (not shown) to be ionized is located within a generation chamber 114 of the ion source 108. The dopant gas, for example, can be fed into the chamber 114 from a gas source (not shown). In another example, it will be appreciated that any number of other suitable mechanisms (not shown) can be implemented or utilized to excite free electrons within the ion generation chamber 114, such as RF or microwave excitation sources, electron beam injection sources, electromagnetic sources and/or a cathode operable to create an arc discharge within the chamber. Accordingly, the excited electrons collide with the dopant gas molecules, and ions are thereby generated. In general, positive ions are generated, however, the present invention contemplates the generation of negative ions, as well, and all such ion generating systems are contemplated as falling within the scope of the present invention.

The ions are controllably extracted through an aperture or slit 116 in the chamber 114 via an ton extraction assembly 118, wherein the extraction assembly comprises a plurality of extraction and/or suppression electrodes 120A and 120B. The extraction assembly 118, for example, can comprise a separate extraction power supply (not shown) to bias the extraction and/or suppression electrodes 120A and 120B in order to accelerate the ions from the generation chamber 114.

It will be appreciated that since the ion beam 112 comprises like charged particles, the ion beam may have a tendency to blow up or expand radially outwardly as the like charged particles repel one another. It will be further appreciated that beam blow up can be exacerbated in low energy, high current (known in the art as high perveance) ion beams, wherein many like-charged particles are moving in the same direction relatively slowly, such that an abundance of repulsive forces among the particles exists with little particle momentum to maintain the particles moving In the direction of the nominal beam path 113. Accordingly, in accordance with one example, the extraction assembly 118 is configured such that the ion beam 112 is generally extracted at an energy sufficiently high enough such that the spot ion beam does not blow up (i.e. so that the particles have sufficient momentum to overcome repulsive forces that can lead to the ion beam blowing up). In another example, in order to promote beam containment, it can be advantageous to transfer the ion beam 112 at a relatively high energy throughout the system, wherein the energy of the ion beam may be optionally reduced just prior to impacting a workpiece 122 located within the end station 108, as will be described infra. It should be noted that it can also be advantageous to generate and transport molecular or cluster ions which can be transported at a relatively high energy while being implanted with a lower equivalent energy, since the energy of the molecule or cluster is divided amongst the dopant atoms of the molecule.

In accordance with another aspect of the invention, the beamline assembly 104 comprises a beamguide 124, a mass analyzer 128, and a beam scanning system 128. The beamline assembly 104, for example, may further comprise a parallelizer 130. The mass analyzer 126, for example, is generally formed at about a ninety degree angle and comprises one or more magnets (not shown), wherein the one or more magnets generally establish a dipole magnetic field within the mass analyzer. As the ion beam 112 enters the mass analyzer 126, it is correspondingly bent via the magnetic field such that ions of an inappropriate charge-to-mass ratio are generally rejected. More particularly, ions having too great or too small a charge-to-mass ratio are deflected into side walls 132 of the mass analyzer 126. In this manner, the mass analyzer 128 primarily allows only those ions in the ion beam 112 which have the desired charge-to-mass ratio to pass therethrough, wherein the ion beam 112 exits the mass analyzer through a resolving aperture 134. It will be appreciated that ion beam collisions with other particles (not shown) in the system 100 can degrade beam integrity, thus, one or more pumps (not shown) may be further included to evacuate, at least, the beamguide 124.

The present invention contemplates a plurality of ranges of ion dosages that can be implanted via the ion implantation system 100. For example, the ion implantation system 100 can be configured to implant ions in a first operating range (e.g., an ion dosage ranging between approximately $5 \times 10^{10}$ and $5 \times 10^{14}$ ions/cm$^2$) and a second operating range (e.g., an ion dosage ranging between approximately $5 \times 10^{14}$ and $1 \times 10^{17}$ ions/cm$^2$). The first and second operating ranges, for example, may not necessarily be defined by dosage alone, but may be further defined by a combination of ion beam current and energy as well as, or in place of, the dosage. Accordingly, the first and second operating ranges maybe associated with ion dosage, ion beam current, and/or ion beam energy. In accordance with one example, a good approximation of operating range can be attained via the desired ion dosage, as will be further described infra.

Conventionally, ion implantation in both the first operating range and second operating range would require two separate ion implantation systems, with each ion implantation system being configured to only implant in a respective one of the first or second ranges of dosage, current, and/or energy. The present invention advantageously utilizes a common architecture in the ion implantation system 100 to accommodate the plurality of operating ranges, wherein a control of the ion implantation system generally determines the operating range, as will be discussed hereafter.

The exemplary beam scanning system 128 illustrated in FIG. 1, for example, comprises a scanning element 138 and a focusing and/or steering element (not shown), wherein power supply 140 is operably coupled to the scanning element 136 (and the focusing and steering element—not shown). The focusing and steering element (not shown), for example, may be configured to receive the mass analyzed spot ion beam 112 and to selectably focus and steer the ion beam to a scan vertex 148 of the scanning element 138.

In accordance with one aspect of the invention, the ion implantation system 100 is configured to selectively operate in a first mode (e.g., associated with the first operating range) and a second mode (e.g., associated with the second operating range). In the first mode, for example, a voltage waveform can be selectively applied to the scanner plates 144A and 144B of the beam scanning system 128 via the power supply 140, wherein the applied voltage waveform is operable to electrostatically scan the spot ion beam 112 back and forth over lime, thus "spreading out" the ion beam along a single beam scan plane 149 (e.g., along the X-axis, as illustrated in FIG. 1A) and defining a scanned ion beam 150, wherein the scanned ion beam can be seen as an elongate "ribbon" beam when time-averaged over a cycle of the applied voltage waveform. The scanned ion beam 150, for example, can be viewed as comprising a plurality of beamlets 151, wherein each beamlet is comprised of the spot ion beam 112 at a respective point in time over the cycle of the applied voltage waveform. The scanned ion beam 150 thus has a width 152 associated therewith when measured along the beam scan plane 149, wherein the width is greater than the cross-sectional dimension of the spot ion beam 112. The width 152 of the scanned ion beam 150, for example, can be as wide or wider than a width (not illustrated) of the workpiece 122. It should be noted that the width 152 of the scanned ion beam 150 may be altered or further focused via the parallelizer 130 downstream of the beam scanning system 128. It will be further appreciated that the scan vertex 148 can be defined as the point in the nominal beam path 113 from which each beamlet 151 appears to originate after having been scanned by the scanning element 138.

In accordance with the present invention, the ion implantation system is further configured to selectively pass the spot ion beam 112 through the beam scanning system 128 generally un-scanned in the second mode, wherein the spot ion beam generally only follows the nominal beam path 113, as illustrated in FIG. 1B. Accordingly, in the second mode of operation of the ion implantation system 100, no voltage is applied to the scanner plates 144A and 144B via the power supply 140, thus letting the spot ion beam 112 travel through the beam scanning system generally unimpeded or unaltered, while benefiting from the beam transport enhancement provided by focusing properties of the parallelizer 130. Focusing elements such as dipole magnets and the like can be designed with focusing properties In both dimensions transverse to the propagation direction of the ion beam 112, wherein this focusing can counteract the expansion of the beam size, thus providing good transmission of the ion beam through restrictions in the beam line, such as vacuum enclosures, apertures etc.

In accordance with another example, the ion beam 112 (e.g., the scanned beam 150 in the case of the first mode of operation illustrated in FIG. 1A or the un-scanned spot ion beam In the case of the second mode of illustrated in FIG. 1B) is passed through the parallelizer 130. The parallelizer 130, for example, comprises two dipole magnets (dipoles) 153A and 153B that are substantially trapezoidal in shape and are oriented to mirror one another. The dipoles 153A and 153B are thus configured to cause the ion beam 112 (e.g., the scanned ion beam 150 or the un-scanned spot ion beam) to bend into a substantially S-shape. Stated another way, the dipoles 153A and 153B have equal angles and opposite bend directions, wherein the dipoles are operable make the divergent beamlets 151 of the scanned ion beam 150 originating from the scan vertex 148, for example, generally parallel. The two symmetric dipoles 153A and 153B are further described in U.S. patent application Ser. No. 11/540,064, filed Sep. 29, 2006, the contents of which is hereby incorporated herein by reference in its entirety. The use of the two symmetric dipoles 153A and 153B permits, in general, isotropic, or spatially uniform properties across the scanned ion beam 150, both in terms of path length of the beamlets 151, as well as first and higher order focusing properties.

Furthermore, similar to the operation of the mass analyzer 128, the S-bend serves to decontaminate the spot ion beam 112 and scanned Ion beam 150, wherein the trajectories (not shown) of neutral particles and/or other contaminants (e.g., environmental particles that enter the beam downstream of the mass analyzer 120) are minimally affected by the dipoles 153A and 153B. As such, some number of these neutrals which do not get bent (such as from an injector), or get bent very little, thus do not impact the workpiece 122.

Figure 2:
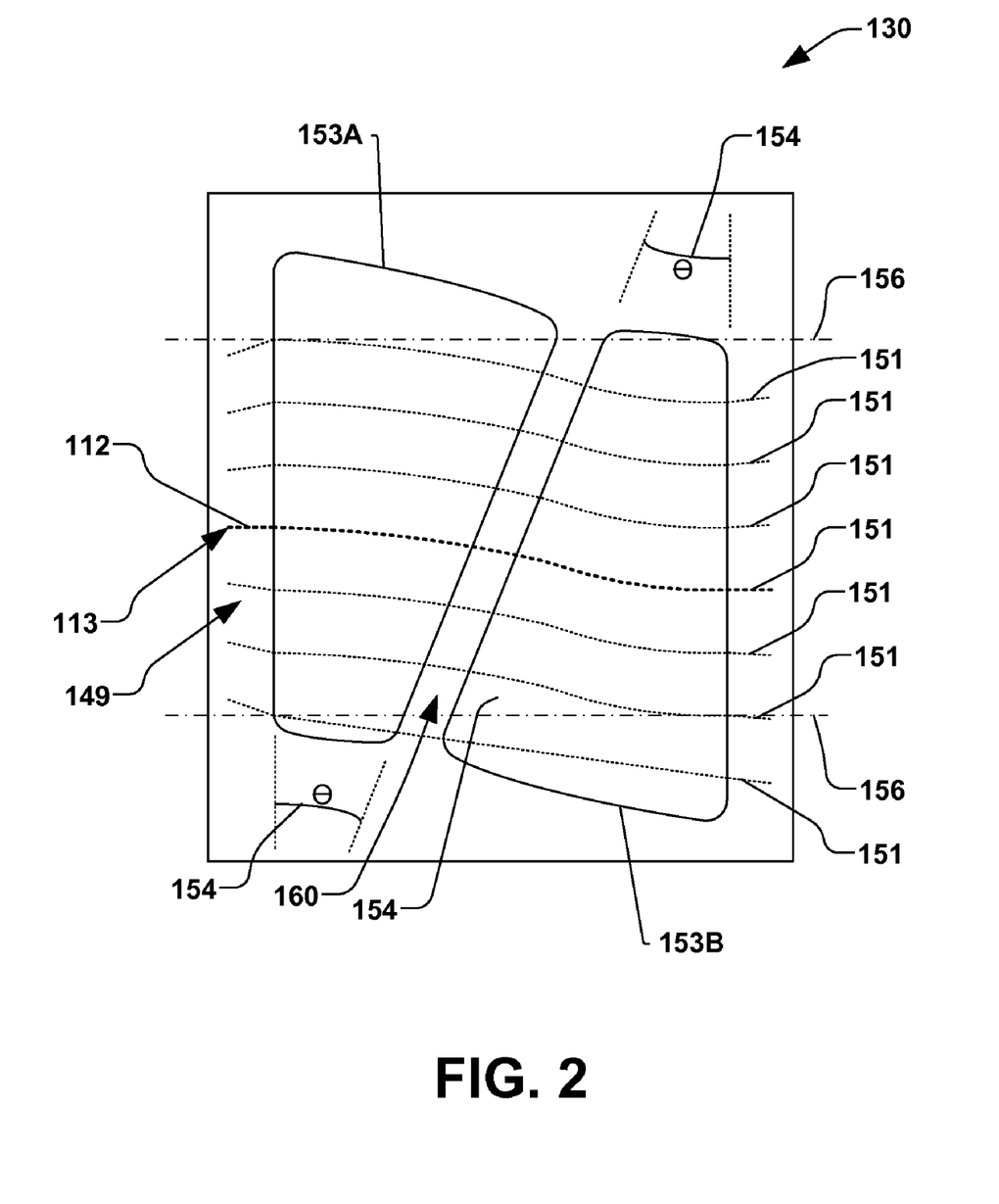
FIG. 2 is a schematic diagram illustrating an exemplary parallelizer according to another aspect of the present invention.

The parallelizer 130, for example, causes the beamlets 151 of the scanned ion beam 150 to become parallel, such that implantation parameters (e.g., implant angle) are made generally uniform across the workpiece 122. Turning to FIG. 2, it can be seen that each of the dipoles 153A and 153B cause the beamlets 151 to bend through an angle Θ 154 relative to a direction 156 parallel to the original trajectory (e.g., the nominal beam path 113) of the ion beam 112, thus giving the beam its substantially S-shape. In one example, Θ 154 is between about 30 degrees and about 40 degrees, but can be any angle greater than about 20 degrees, in any event, because the two dipoles 153A and 153B mirror one another, the respective beamlets 151 are of a substantially equal length 158, as illustrated in FIG. 1A. Alternatively, this can also be stated as each of the beamlets 151 having a constant path length. The symmetry properties of the dipoles thus facilitate uniform implantation parameters (e.g., implant angle). The length 158 of the beamlets 151 is kept relatively short by using relatively small bend angles in the dipoles 153A and 153B. This is advantageous at least because it maintains an overall footprint of the Implantation system 100 relatively compact. Additionally, the dipoles 153A and 153B are generally separated by a gap 160, as the illustrated example of FIG. 2. The gap 180, for example, generally provides an equal drift length for the respective beamlets 151, and may separate the dipoles 153A and 153B by a distance of two times the pole gap of the dipoles (e.g., between about 100 and about 250 millimeters).

Each of the dipoles 153A and 153B may further comprise a plurality of cusping magnets (not shown). In order to help contain and/or otherwise control the ion beam 112 of FIGS. 1A and 1B passing therethrough. The cusping magnets, for example, operate as described in U.S. Pat. No. 6,414,329 to Benveniste et al., the entirety of which is hereby incorporated herein by reference. It will be appreciated that the cusping magnets generally induce a static magnetic field close to the beamline enclosure to confine electrons generated by self-neutralization or any other means so that motion of such electrons in a direction perpendicular to the magnetic field of the cusps is thereby Inhibited. More particularly, the cusping magnets act to confine electrons so that it is difficult for them to move along the magnetic field and reach pole pieces or the walls of the enclosure. In this manner, any contribution of the electrons to further self-neutralization is thereby enhanced. It should be noted that various orientations, sizes, spacings and/or numbers of the cusping magnets about the dipoles 153A and 153B are possible and are contemplated as falling with the scope of the disclosure herein.

Referring again to FIG. 1A, one or more deceleration stages (not shown) may be further positioned downstream of the parallelizer 130. Up to this point in the system 100, the ion beam 112 is generally transported at a relatively high energy level, such as to mitigate the propensity for beam blow up. For example, the propensity of beam blow up can be particularly high where beam density is elevated, such as at the resolving aperture 134. Similar to the ion extraction assembly 118, scanning element 136 and the focusing and steering element (not shown), the deceleration stage comprises one or more electrodes (not shown) coupled to a power supply (not shown), wherein the one or more electrodes of the deceleration stage are operable to selectively decelerate the ion beam 112 (e.g., the scanned ion beam 150). For example, deceleration of the ion scanned ion beam 150 is particularly beneficial in the first mode of operation of the ion implantation system 100, wherein the ion beam 112 can travel at a substantially high energy prior to being scanned by the beam scanning system, and the energy of the scanned ion beam 150 can be lowered prior to impacting the workpiece 122 for the implantation of ions in the first operating range. In accordance with one example, the deceleration stage (not shown) is operable to selectively further filter neutrals and other ions of non-desired energies out of the ion beam 112 (e.g., the scanned ion beam 150), and ion species of the desired energy will continue to follow the desired path of the ion beam and can be selectively decelerated via the deceleration stage.

In accordance with another exemplary aspect of the invention, in the second mode of operation of the ion implantation system 100, no voltage may be applied to the electrodes of the deceleration stage (not shown), therein generally permitting the spot ion beam 112 to pass through the deceleration stage generally unaffected.

It should be noted that in the present example, two electrodes 120A and 120B, and 144A and 144B are respectively illustrated in the ion extraction assembly 118 and scanning element 138. It should be further noted, however, that extraction assembly 118, scanning element 138, focusing and steering element (not shown) and deceleration stage (not shown) may comprise any suitable number of electrodes arranged and biased to accelerate and/or decelerate ions, as well as to focus, bend, deflect, converge, diverge, scan, parallelize and/or decontaminate the ion beam 112, such as provided in U.S. Pat. No. 6,777,696 to Rathmell et al., the entirety of which is hereby incorporated herein by reference. Additionally, the focusing and steering element may comprise electrostatic deflection plates (e.g., one or more pairs thereof), as well as an Einzel lens, quadrupoles and/or other focusing elements to selectively focus the ion beam 112.

The end station 108 illustrated in FIGS. 1A and 1B, for example, comprises a "serial" type end station, wherein a single workpiece 122 is translated through the path of the ion beam 112 via a workpiece scanning system 167 for ion implantation thereto. Alternatively, the end station 106 may comprise a "batch" type end station, wherein a plurality of workpieces (not shown) may be placed on a spinning disk (not shown) and passed through the ion beam 112. In a preferred embodiment, the workpiece scanning system 167 is configured to support the single workpiece 122 and to mechanically scan the single workpiece in one or more dimensions or directions generally orthogonal to the ion beam path 113 through the ion beam 112. The workpiece scanning system 167, for example, may comprise the two-dimensional scanning system described in U.S. Pat. No. 7,135,691 to Berrian et al., the contents of which are hereby incorporated by reference herein in its entirety. Alternatively, any workpiece scanning system 167 capable of translating the workpiece 122 through the path of the ion beam 112 in one or more directions generally orthogonal to the ion beam path 113 is contemplated as falling within the scope of the present invention.

For example, in the first mode of operation associated with the first operating range, the workpiece scanning system 167 may mechanically translate the workpiece 122 in a first direction (e.g., Y or slow scan direction) while the ion beam 112 is scanned via the scanning element 138 (thus defining the scanned ion beam 150) in a second direction (e.g., X or fast scan direction) to implant ions over the entire workpiece. Accordingly, in the first mode, the ion implantation system 100 can be operated in a "mechanically-limited" throughput manner, as will be further discussed infra, wherein medium to low-dose implants can be achieved at a substantially high workpiece throughput, and wherein the upper limit of the workpiece throughput is mainly governed by mechanical capabilities of the workpiece scanning system 167 to translate workpieces 122 through the scanned ion beam 150.

In accordance with another exemplary aspect of the invention, the parallelizer 130 can be omitted, and the workpiece scanning system 167 can further rotate the workpiece 122 generally about the Y axis when the ion implantation system 100 is operated in the first mode, as described in U.S. Pat. No. 6,992,310 to Ferrara et al., the contents of which are hereby incorporated by reference herein. By rotating the workpiece 122 about the Y-axis, a substantially constant implantation angle can be achieved on the workpiece.

Figure 3A:
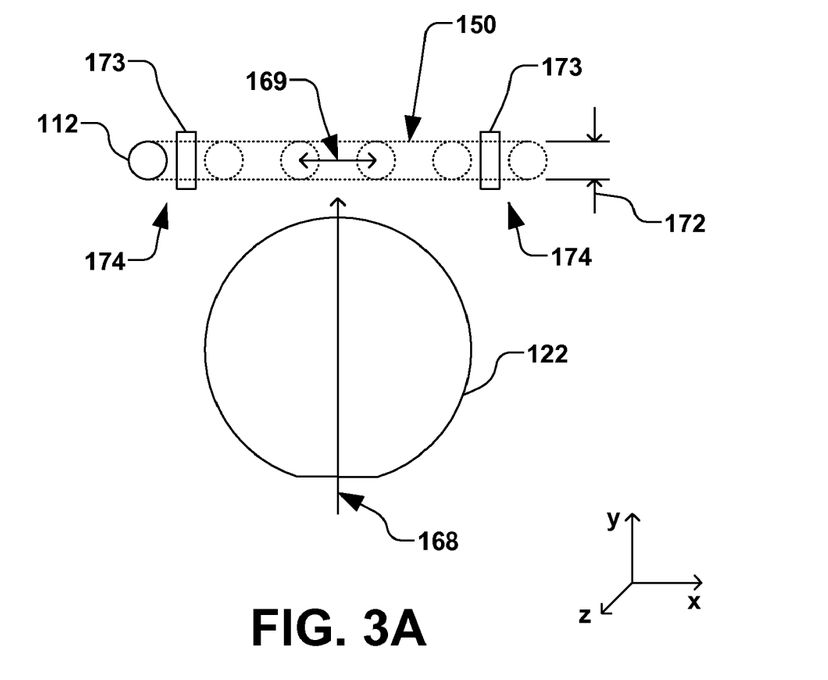
FIGS. 3A and 3B illustrate an exemplary first mode of operation of ion implantation according yet another aspect of the invention.
Figure 3B:
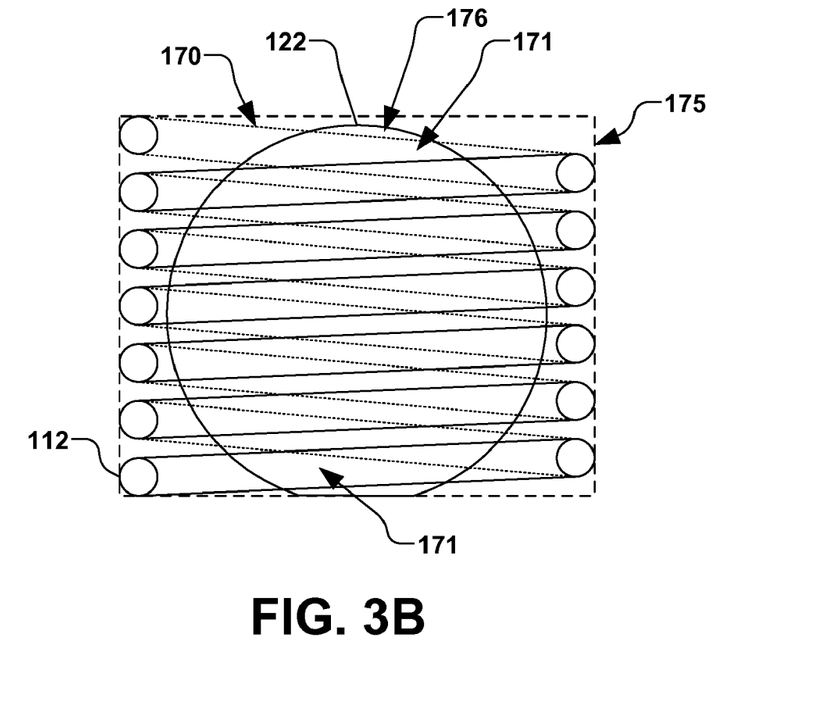

In the first mode of operation associated with the first operating range, for example, the ion beam is scanned relative to the workpiece, as illustrated in FIGS. 3A and 3B. FIG. 3A, for example, the workpiece is shown traveling in the Y-direction (illustrated as arrow 188), while the ion beam 112 Is scanned in the X-direction (illustrated as arrow 189). Accordingly, as illustrated In FIG. 38, the ion beam 112 traces a trajectory 170 that forms stripes 171 across the workpiece 122 as the ion beam is scanned relative to the traveling workpiece. A width 172 of each stripe 171 (shown in FIG. 3A), for example, is associated with the size of the ion beam 112. Accordingly, the ion beam 112 is scanned across the workpiece 122 and then off the workpiece in order to maintain correct ion dosages, wherein one or more beam monitoring devices 173 positioned beyond the circumference of the workpiece generally permit real-time monitoring of the ion beam at extents 174 of the beam travel. Thus, as shown in FIG. 38, a total area 175 swept by the ion beam 112 is larger than an area 176 of the workpiece 122, wherein the ion beam spends a considerable amount of time while being off the workpiece (e.g., when the ion beam does not impact the workpiece).

The ratio of time on the workpiece 122 to time off the workpiece generally defines the ion beam utilization, U. Alternatively, the ion beam utilization U can be defined, at a constant ion beam current, I, as the desired quantity of dopant implanted into the workpiece to the quantity of dopant delivered by the implantation system during the implantation process.

With a desired dosage D of dopant (per square unit) to be implanted into a given workpiece, the implant time $t_{implant}$ for the workpiece in an ion implanter can be expressed as:

$$t_{implant} = D \times A/q/I/U \qquad (1)$$

where A is the total area of the workpiece to be implanted by the ion beam, and q is the ion charge. It will be appreciated that, depending on the width of the ion beam, the utilization can range from highs approaching approximately 80% to less than 20% in the first mode of operation. Furthermore, with continuous operation of the ion implanter, such as when implanting ions into multiple workpieces in a serial manner, the total throughput, or total processing time $t_{total}$ per workpiece, of the ion implanter can be expressed as:

$$t_{total} = t_{implant} + t_{handling} \qquad (2)$$

where $t_{implant}$ is the time associated with implanting Ions into each workpiece as described above, and $t_{handling}$ is the handling time associated with transferring the workpiece into and out of the ion implanter. If, for example, the implant time $t_{implant}$ for a given workpiece is short, (e.g. significantly shorter than the handling time $t_{handling}$), then the throughput of the implanter is mainly governed by the handling time, and the ion implanter is operated in a "mechanically limited" throughput manner or mode.

In the second mode of operation associated with the second operating range, in accordance with yet another example, the workpiece scanning system 167 is configured to mechanically translate the workpiece 122 in both the first direction (Y or slow scan direction) and the second direction (X or fast scan direction) while the ion beam 122 remains an un-scanned spot ion beam for higher dosage, higher current, and/or higher energy implants, as Illustrated in FIG. 1B. Accordingly, in the second mode, the ion implantation system 100 can be operated in an "implant-limited" throughput manner, as will be described infra, wherein high-dose implants can be achieved, and wherein an upper limit of the dosage, current, and/or energy of the implants is mainly governed by the capabilities of the terminal 102, beamguide 124, and mass analyzer 126. Throughput of workpieces 122 in the second mode is thus generally limited by the beam current performance of the beamline.

Figure 4A:
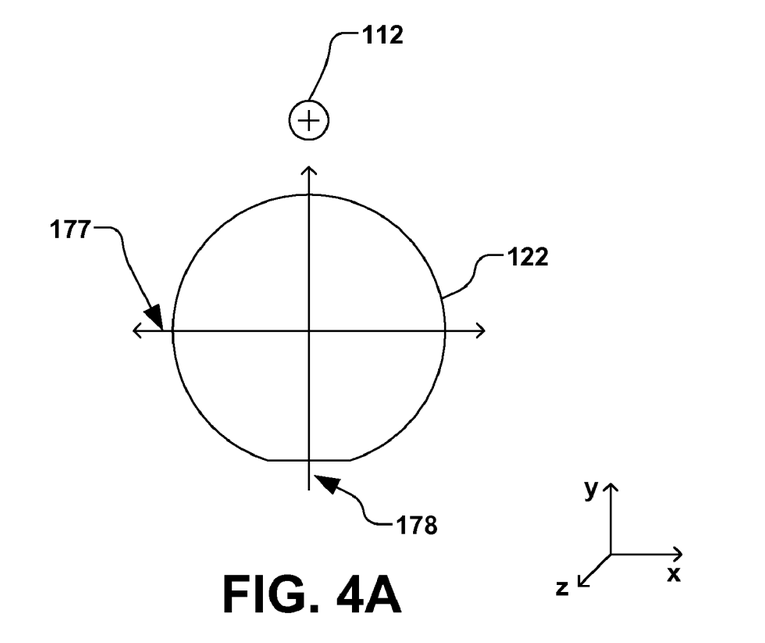
FIGS. 4A and 4B illustrate an exemplary second mode of operation of ion implantation according to still another aspect of the invention.
Figure 4B:
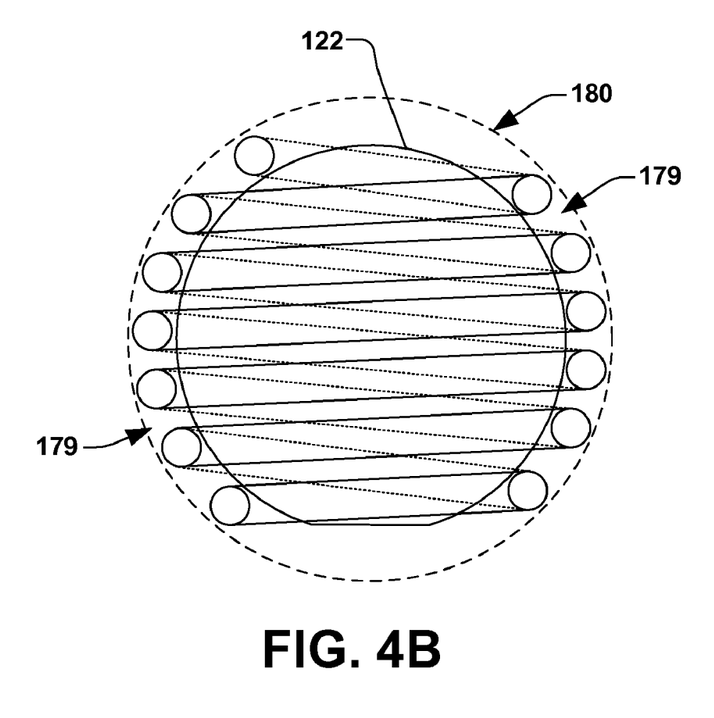

In second mode of operation, as illustrated in FIGS. 4A and 4B, for example, the workpiece 122 is swept through the stationary ion beam 112 in both the X-direction (illustrated as arrow 177) and Y-direction (illustrated as arrow 178) where the utilization U is again defined by the time that the ion beam spends on the workpiece versus the total implant time. A real-time current monitoring device (not shown) is located, for example, behind the workpiece, such that the scan widths are given by beam size. It should be noted that while arrows 177 and 178 are illustrated as linear translations, curvilinear translations are also contemplated as falling within the scope of the present invention, such as a pendulum-type translation of the workpiece 122 in the X-direction.

Speeds of two-dimensional mechanical scans of the workpiece 122 are generally slower than scan speeds of electrically and magnetically scanned systems. Accordingly, it is advantageous to mechanically scan the workpiece 122 when the implant time is long, (e.g. when the desired implant dose is high). In such a case, the times during which the ion beam 112 is off the workpiece can be made relatively short (e.g., as illustrated in FIG. 4B) by maintaining high accelerations in a workpiece turn-around area 179 (e.g., the time associated with the reversal of direction of workpiece travel), thus achieving higher utilizations than can be achieved in the first mode, (e.g., approaching 100% utilization), wherein a relative area 180 of beam/workpiece travel is minimized. Thus, in the second mode of operation, the workpiece 122 throughput is primarily defined by the implant time $t_{implant}$, which is typically much larger than the workpiece handling time $t_{handling}$. As seen in equation (1), higher utilizations lead to shorter implant times, thus leading to improved throughput and productivity for the ion implanter.

According to yet another example, as illustrated in FIGS. 1A and 1B, a dosimetry system 182 is included in the end station 108 near the workpiece 122 for calibration measurements prior to implantation operations. In one example, during calibration, the ion beam 112 passes through dosimetry system 182, wherein the dosimetry system comprises one or more profilers 184 operable to translate along a profiler path 186, thereby measuring one or more characteristics of the ion beam (e.g., operable to measure a profile of the scanned ion beam and/or the spot ion beam 112). The profiler 184, for example, may comprise a current density sensor, such as a Faraday cup, operable to measure a current density of the ion beam 112. The measured current density, for example, may be utilized for a control of the ion implantation system via a system controller 188 operably coupled thereto.

The system controller 188, for example, may comprise a computer, microprocessor, or other control system, wherein the controller is operable to control one or more of the terminal 102, mass analyzer 128, beam scanning system 128, focusing and steering element (not shown), scanning element 136, parallelizer 130, deceleration stage (not shown), and the workpiece scanning system 167. In one example, the system controller 188 is configured to receive measurement values from the dosimetry system 182 and to control the implantation of ions into the workpiece 122 based on the received measurement values. The system controller 188, for example, is operable to control the formation of the ion beam 112 via a control of the ion generation chamber 114 and extraction assembly 118. The system controller 188 is further operable to control the scanning element 133 via the power supply 140, wherein the ion beam 112 is selectively scanned, based on the desired operating range (e.g., the first mode or the second mode of operation of the ion implantation system 100).

For example, based on the desired implantation dosage, current, and/or energy, the controller 188 is configured operate the ion implantation system 100 in the first mode, wherein the ion beam 112 is scanned by the beam scanning system 128 in the X direction, and wherein the controller controls the workpiece scanning system 167 to translate the workpiece 122 in the Y direction, therein implanting the workpiece with ions of the scanned ion beam 150. In the second mode, the controller 188 is configured to pass the ion beam 112 through the beam scanning system 128 generally unaltered or unscanned, wherein the controller is further configured to control the workpiece scanning system 167 such that the workpiece 122 is translated in both the X direction and the Y direction through the generally stationary spot ion beam traveling along the ion beam path 113.

Accordingly, the ion implantation system 100 can be adjusted via the system controller 188 in order to facilitate desired ion implantation based upon a desired dosage, current, and/or energy of ion implantation, as well as based on the one or more measured characteristics provided by the dosimetry system 182. In accordance with one example, the ion beam 112 can initially be established according to predetermined beam tuning parameters (e.g., the predetermined beam tuning parameters may be stored/loaded into the system controller 188). Then, based upon feedback from the dosimetry system 182, the parallelizer 130 can be adjusted to alter the degree of S-bend to alter an implantation angle, for example. Likewise, the energy level of the scanned ion beam 150, for example, can be adapted to adjust junction depths by controlling a bias applied to the electrodes 120A and 120B in the ion extraction assembly 118 and electrodes in the deceleration stage (not shown). In another example, the strength and orientation of magnetic field(s) generated in the mass analyzer 126 can be further controlled, such as by regulating the amount of electrical current running through field windings associated therewith, therein altering the charge-to-mass ratio of the ion beam 112. The angle of implantation can be further controlled by adjusting the voltage applied to the steering element (not shown).

Figure 5:
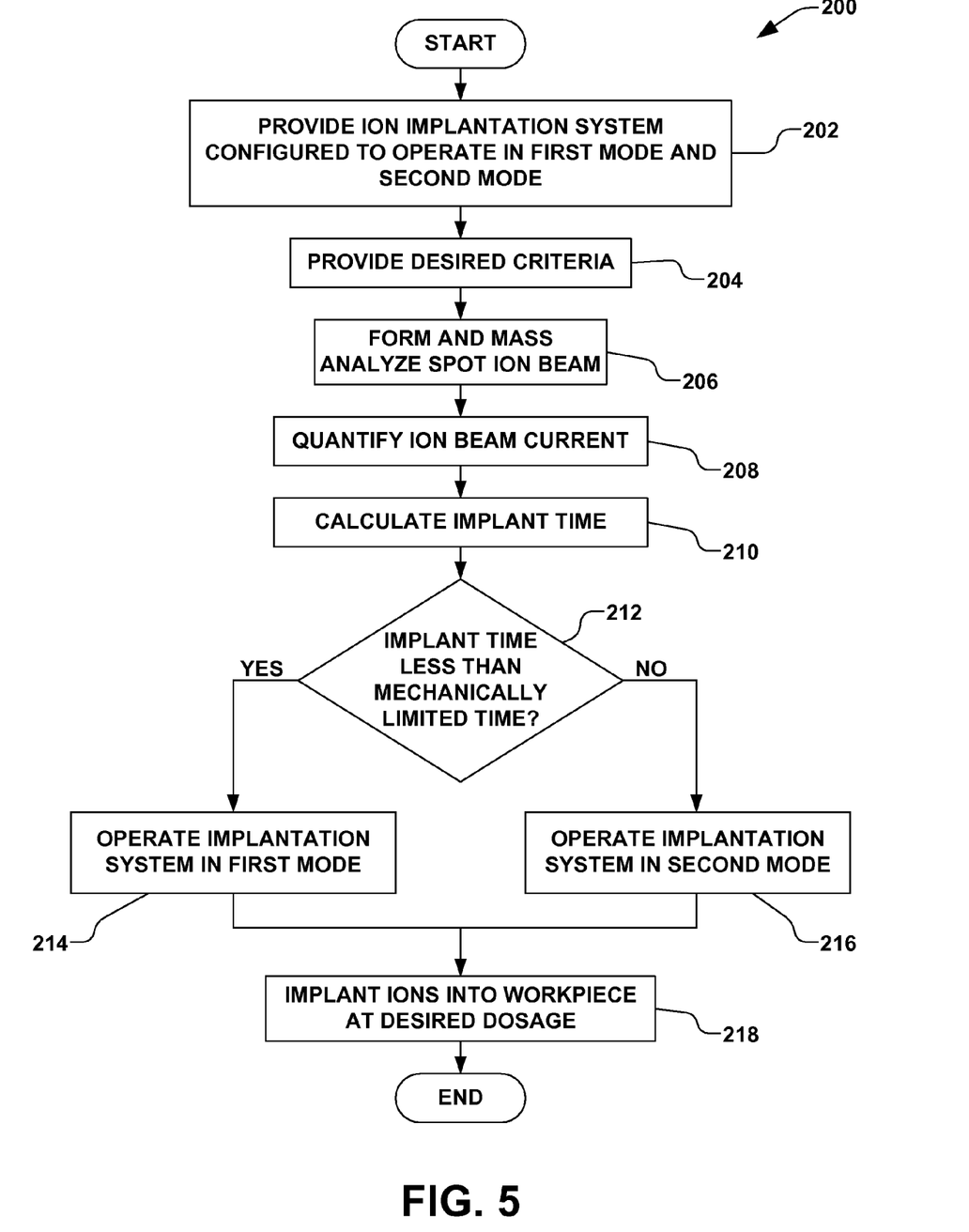
FIG. 5 illustrates an exemplary method for implanting ions into a workpiece at a plurality of operating ranges utilizing a common ion implantation system in accordance with a further exemplary aspect of the present invention.

In accordance with another aspect of the present invention, FIG. 5 illustrates an exemplary method 200 for implanting ions of various operating ranges into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 begins at act 202, wherein an ion implantation system, such as the ion implantation system 100 of FIGS. 1A and 1B, is provided, wherein the ion implantation system is configured to implant ions of a spot ion beam into a workpiece in a plurality of operating ranges. For example, the ion implantation system is configured to operate in a first mode and a second mode, wherein the spot ion beam is scanned by a beam scanning mechanism in the first mode, and wherein the spot ion beam remains un-scanned in the second mode. In act 204 of FIG. 5, a set of desired criteria, such as a desired dosage, current, and/or energy of ions to be implanted into the workpiece, is provided. For example, a desired dosage of implantation is provided in act 204, wherein the desired dosage ranges from a low dosage implant (e.g., approximately $5 \times 10^{10}$ and $5 \times 10^{14}$ ions/cm$^2$) to a high dosage implant (e.g., approximately $5 \times 10^{14}$ and $1 \times 10^{17}$ ions/cm$^2$). The set of desired criteria, for example, may further or alternatively comprise one or more of ion beam utilization, throughput considerations, productivity considerations, or other criteria related to the implant.

In act 206, the spot ion beam is formed and mass analyzed, wherein the spot ion beam has a generally circular cross section, and wherein the ion beam has an energy and current associated with the desired criteria provided in act 204. In act 208, one or more properties of the spot ion beam are quantified. For example, the current and/or size of the spot ion beam is measured or determined in act 208, such as via the dosimetry system 168 of FIGS. 1A and 1B. In act 210 of FIG. 5, an implant time (e.g., a time needed to implant ions into the entire workpiece) is determined, wherein the determination of the implant time is based on the quantified one or more properties of the spot ion beam. For example, the in order to implant the entire workpiece at the desired dosage provided in act 204, an implant time is calculated based on the quantified current and/or size of the spot ion beam.

In act 212, the implant time is then compared to a scan time associated with a mechanically limited scan time. The mechanically limited scan time, for example, is a minimal time associated with operating the ion implantation system 100 in the second mode, and wherein the workpiece scanning system 167 of FIGS. 1A and 1B translates the workpiece 122 in the X direction and the Y direction at respective maximum velocities or limits, in the comparison of act 212 of FIG. 5, if the implant time determined in act 210 is generally less than the mechanically limited scan time (a relatively short implant time), and, for example, sufficient ion beam current is available, then the ion implantation system is operated in the first mode in act 214, wherein the ion beam is scanned via the beam scanning system 128, as illustrated in FIG. 1A. If the implant time determined in act 210 of FIG. 5 is generally greater than the mechanically limited scan time (a relatively long implant time), then the ion implantation system is operated in the second mode in act 216, wherein the ion beam remains un-scanned as illustrated in FIG. 18, wherein the workpiece scanning system 167 translates the workpiece 122 in both the X direction and the Y direction. Accordingly, regardless of whether the ion implantation system 100 is operated in the first mode or the second mode, an implantation of ions into the workpiece 122 is performed in act 218, wherein the implantation meets the set of desired criteria (e.g., desired dosage).

Thus, the present invention provides an architecture and method for implanting ions in a plurality of operating ranges while utilizing a common implantation system. As such, desired dosages, currents, and/or energies of ion implantations, as well as utilization and productivity efficiencies can be achieved using the common implantation system, regardless of the operating range, thus reducing equipment costs associated with dose-specific systems, and also increasing the utilization of the current ion implantation system.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that, is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
   an ion source configured to generate a beam of ions;
   a mass analyzer configured to mass resolve the beam of ions;
   a beam scanning system positioned downstream of the mass analyzer, wherein the beam scanning system is configured to scan the beam of ions along a single beam scan plane when the ion implantation system is operated in a first mode, therein defining a scanned ion beam in the first mode, and wherein the beam scanning system is configured to pass the beam of ions therethrough un-scanned when the ion implantation system is operated in a second mode, therein defining an un-scanned spot ion beam;
   a parallelizer positioned downstream of the beam scanning system, wherein contaminants are generally filtered out while concurrently parallelizing the scanned ion beam into a plurality of parallel beamlets such that the plurality of parallel beamlets have a substantially equal length; and
   a workpiece scanning system positioned downstream of the parallelizer and configured to selectively translate a workpiece in one or more directions through the scanned ion beam or spot ion beam, wherein the translation is based on the ion implantation system being operated in the respective first mode or second mode.

2. The ion implantation system of claim 1, where the parallelizer comprises at least one pair of dipole magnets, wherein the parallelizer is configured to selectively bend the scanned ion beam into a substantially S-shape when the beam scanning system is operated in the first mode.

3. The ion implantation system of claim 2, where the respective dipole magnets are substantially trapezoidal in shape and oriented to mirror one another.

4. The ion implantation system of claim 2, where the respective dipole magnets bend the scanned ion beam greater than about 20 degrees.

5. The ion implantation system of claim 4, wherein the parallelizer is configured to selectively bend the un-scanned spot ion beam into a substantially S-shape when the beam scanning system is operated in the second mode.

6. The ion implantation system of claim 1, further comprising a controller operatively coupled to the ion source, mass analyzer, beam scanning system, parallelizer, and workpiece scanning system, and configured to control the operation of at least one of the ion source, mass analyzer, beam scanning system, parallelizer, and workpiece scanning system based, at least in part, on a desired dosage of ions to be implanted into the workpiece.

7. The ion implantation system of claim 6, wherein the controller is configured to operate the beam scanning system in the first mode when a desired dosage of ions implanted into the workpiece ranges between approximately $5 \times 10^{10}$ and $5 \times 10^{14}$ ions/cm$^2$, and wherein the controller is configured to operate the beam scanning system in the second mode when the desired dosage of ions implanted into the workpiece ranges between approximately $5 \times 10^{14}$ and $1 \times 10^{17}$ ions/cm$^2$.

8. The ion implantation system of claim 1, further comprising a measurement component configured to determine one or more characteristics of the beam of ions, wherein the controller is further operably coupled to the measurement component and configured to further control the operation of at least one of the ion source, mass analyzer, beam scanning system, parallelizer, and workpiece scanning system based, at least in part, on the determined one or more characteristics of the beam of ions.

9. The ion implantation system of claim 1, further comprising a decelerating filter positioned generally between the parallelizer and the workpiece scanning system, wherein the decelerating filter is configured to selectively decelerate the beam of ions.

10. The ion implantation system of claim 1, further comprising a focusing and steering component positioned generally between the mass analyzer and the beam scanning system, wherein the focusing and steering component is configured to selectively focus and steer the beam of ions to a scanning vertex of the beam scanning system.

11. A method of implanting ions into a workpiece in an ion implantation system, the method comprising:
   providing a set of desired criteria for implanting ions into the workpiece;
   forming a spot ion beam based on the set of desired criteria, wherein the spot ion beam has a generally elliptical cross section;
   quantifying one or more properties of the spot ion beam;

determining an implant time, wherein the determination of the implant time is based on the quantified one or more properties of the spot ion beam;

comparing the implant time to a mechanically limited scan time;

operating the ion implantation system in a first mode when the implant time is generally less than the mechanically limited scan time, wherein in the first mode, the spot ion beam is scanned along a single beam scan plane, therein defining a scanned ion beam, and wherein the workpiece is translated through the scanned ion beam in at least one dimension; and operating the ion implantation system in a second mode when the implant time is generally greater than the mechanically limited scan time, wherein in the second mode, the workpiece is scanned through the spot ion beam in at least two dimensions.

12. The method of claim 11, wherein the set of desired criteria comprises one or more of a desired dosage, current, and energy of ions to be implanted into the workpiece.

13. The method of claim 11, wherein the one or more properties of the spot ion beam comprise one or more of a current, energy, and size of the spot ion beam associated with the desired criteria.

14. The method of claim 11, wherein the mechanically limited scan time is a minimal time associated with operating the ion implantation system in the second mode wherein the workpiece is translated in two dimensions at respective maximum velocities or limits.

15. The method of claim 11, further comprising parallelizing the scanned ion beam when the ion implantation system is operated in the first mode.

16. The method of claim 15, wherein parallelizing the scanned ion beam comprises bending the scanned ion beam into a substantially S-shape, wherein contaminants are generally removed, while concurrently parallelizing the scanned ion beam into a plurality of parallel beamlets such that the plurality of parallel beamlets have a substantially equal length.

17. The method of claim 11, wherein the spot ion beam is bent into a substantially S-shape when the ion implantation system is operated in the second mode.

18. An ion implantation system, comprising:

an ion source configured to generate a beam of ions;

a mass analyzer configured to mass resolve the beam of ions;

a beam scanning system positioned downstream of the mass analyzer, wherein the beam scanning system is configured to scan the beam of ions along a single beam scan plane when the ion implantation system is operated in a first mode, therein defining a scanned ion beam in the first mode, and wherein the beam scanning system is configured to pass the beam of ions therethrough un-scanned when the ion implantation system is operated in a second mode, therein defining an un-scanned spot ion beam; and a workpiece scanning system positioned downstream of the beam scanning system and configured to selectively translate a workpiece in one or more directions through the scanned ion beam or spot ion beam, based on the ion implantation system being operated in the respective first mode or second mode.

19. The ion implantation system of claim 18, further comprising a parallelizer positioned downstream of the beam scanning system, wherein the parallelizer is configured to selectively bend the scanned ion beam into a substantially S-shape when the ion implantation system is operated in the first mode, wherein contaminants are generally filtered out while concurrently parallelizing the scanned ion beam into a plurality of parallel beamlets such that the plurality of parallel beamlets have a substantially equal length.

20. The ion implantation system of claim 18, wherein the workpiece scanning system is further configured to rotate the workpiece about one or more axes, based on the ion implantation system being operated in the respective first mode or second mode.

* * * * *